(12) United States Patent
Cannata et al.

(10) Patent No.: US 9,029,783 B2
(45) Date of Patent: May 12, 2015

(54) MULTILAYERED MICROBOLOMETER FILM DEPOSITION

(75) Inventors: Robert F. Cannata, Santa Barbara, CA (US); Yaroslava Petraitis, Ventura, CA (US); Patrick Franklin, Santa Barbara, CA (US); Robert Simes, Santa Barbara, CA (US); Richard E. Bornfreund, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 533 days.

(21) Appl. No.: 13/157,762

(22) Filed: Jun. 10, 2011

(65) Prior Publication Data

US 2012/0312992 A1    Dec. 13, 2012

(51) Int. Cl.
| | |
|---|---|
| *G01J 5/02* | (2006.01) |
| *G01J 5/20* | (2006.01) |
| *H01L 27/146* | (2006.01) |

(52) U.S. Cl.
CPC ............ *G01J 5/20* (2013.01); *H01L 27/14634* (2013.01); *H01L 27/14669* (2013.01)

(58) Field of Classification Search
CPC .................................. G01J 5/20; G01J 5/0853
USPC ..................................................... 250/338.1
See application file for complete search history.

(56) References Cited

U.S. PATENT DOCUMENTS

| | | | | |
|---|---|---|---|---|
| 5,367,167 | A * | 11/1994 | Keenan ...................... | 250/338.4 |
| 5,589,689 | A * | 12/1996 | Koskinen .................. | 250/339.01 |
| 6,028,309 | A * | 2/2000 | Parrish et al. .................. | 250/332 |
| 6,222,454 | B1 * | 4/2001 | Harling et al. ................. | 340/584 |
| 6,590,710 | B2 * | 7/2003 | Hara et al. ...................... | 359/579 |
| 8,471,204 | B2 * | 6/2013 | Bornfreund .................... | 250/330 |
| 2003/0116711 | A1 * | 6/2003 | Hara et al. ..................... | 250/338.1 |
| 2006/0169902 | A1 * | 8/2006 | Watanabe ................... | 250/338.1 |
| 2006/0186339 | A1 * | 8/2006 | Sasaki et al. ................ | 250/338.1 |
| 2007/0170359 | A1 * | 7/2007 | Syllaios et al. ............. | 250/338.1 |
| 2007/0170360 | A1 * | 7/2007 | Gooch et al. ................. | 250/338.1 |
| 2008/0237467 | A1 * | 10/2008 | Oda et al. .................... | 250/338.3 |
| 2010/0133536 | A1 * | 6/2010 | Syllaios et al. .................. | 257/53 |
| 2011/0315981 | A1 * | 12/2011 | Xu et al. .......................... | 257/43 |

FOREIGN PATENT DOCUMENTS

| | | |
|---|---|---|
| CN | 101881667 A | 10/2010 |
| WO | WO 00/12985 | 3/2000 |

OTHER PUBLICATIONS

Zhou, et al. Comparative Investigation of Infrared Optical Absorption Properties of Silicon Oxide, Oxynitride and Nitride Films, 2011, pp. 1-4, vol. 7995.79950T, SPIE, China.

(Continued)

*Primary Examiner* — David Porta
*Assistant Examiner* — Djura Malevic
(74) *Attorney, Agent, or Firm* — Haynes and Boone LLP (57) ABSTRACT

A microbolometer is disclosed, including a bottom multilayered dielectric, having a first silicon oxynitride layer and a second silicon oxynitride layer disposed above the first silicon oxynitride layer, the first and second silicon oxynitride layers having different refractive indices. The microbolometer further includes a detector layer disposed above the bottom multilayered dielectric, the detector layer comprised of a temperature sensitive resistive material, and a top dielectric disposed above the detector layer.

24 Claims, 11 Drawing Sheets

(56) References Cited

OTHER PUBLICATIONS

Gunde, Klanjsek, M., et al., "Infrared Optical Constants and Dielectric Response Functions of Silicon Nitride and Oxynitride Films", phys. Stat. sol. (a), 2001, pp. 439-449, v. 183, No. 2.

Kol'Tsov, Yu I., et al., "Spectrophotometric Determination of Phase Composition and Thickness of Oxynitride Coatings", Consultants Bureau, 1974, pp. 348-350.
Diedenhofen, Silke, L., et al., "Broad-band and Omnidirectional Antireflection Coatings Based on Semiconductor Nanorods", Wiley InterScience, 2009, pp. 973-978, v. 21.

* cited by examiner

MULTILAYERED MICROBOLOMETER FILM DEPOSITION

TECHNICAL FIELD

The present disclosure relates generally to infrared cameras, and, more particularly, to microbolometer detectors and focal plane arrays.

BACKGROUND

During the 1880's, an infrared detector called the bolometer was developed. The bolometer operates on the principle that the electrical resistance of the bolometer material changes with respect to the bolometer temperature, which in turn changes in response to the quantity of absorbed incident infrared radiation. These characteristics can be exploited to measure incident infrared radiation on the bolometer by sensing the resulting change in its resistance. When used as an infrared detector, the bolometer is generally thermally isolated from its supporting substrate or surroundings to allow the absorbed incident infrared radiation to generate a temperature change in the bolometer material.

Microbolometer arrays are typically fabricated on monolithic silicon substrates or integrated circuits by constructing two-dimensional arrays of closely spaced air bridge structures coated with a temperature sensitive resistive material, such as vanadium oxide, that absorbs infrared radiation. The air bridge structure provides thermal isolation between the microbolometer detector and the silicon substrate.

With each microbolometer functioning as a pixel within the array, a two-dimensional image or picture representation of the incident radiation can be generated by translating the changes in resistance of each microbolometer into a time-multiplexed electrical signal that can be displayed on a monitor or stored in a memory. The circuitry used to perform this translation is commonly known as the read out integrated circuit (ROIC), and may be fabricated as an integrated circuit in the silicon substrate. The microbolometer array may then be fabricated on top of the ROIC. The combination of the ROIC and microbolometer array is commonly known as a microbolometer infrared focal plane array (FPA).

Conventional microbolometers may have various performance limitations, such as for example decreased sensitivity due to inadequate thermal isolation, a temperature coefficient of resistance mismatch of circuit elements, a contraction of optical absorption spectra, and/or a limited spectral response range. As a result, there is a need for improved detectors and manufacturing processes that may enhance detector performance.

SUMMARY

The present disclosure provides for various advantageous microbolometers, focal plane arrays, and methods of fabricating a microbolometer, in accordance with one or more embodiments. For example, in accordance with an embodiment, a microbolometer includes a bottom multilayered dielectric, having a first silicon oxynitride layer and a second silicon oxynitride layer disposed above the first silicon oxynitride layer, the first and second silicon oxynitride layers having different refractive indices. The microbolometer may further include a detector layer disposed above the bottom multilayered dielectric, the detector layer comprised of a temperature sensitive resistive material, and a top dielectric disposed above the detector layer.

In accordance with another embodiment of the present disclosure, a focal plane array includes a readout circuit (ROIC), and a plurality of microbolometers electrically coupled to the ROIC, each microbolometer including elements as those described above and herein.

In accordance with yet another embodiment of the present disclosure, a method for fabricating a microbolometer includes forming a first silicon oxynitride layer having a first refractive index, and forming a second silicon oxynitride layer above the first silicon oxynitride layer, the second silicon oxynitride layer having a second refractive index different from the first refractive index. The method may further include forming a detector layer above the second silicon oxynitride layer, the detector layer comprised of a temperature sensitive resistive material, and forming a top dielectric above the detector layer.

The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
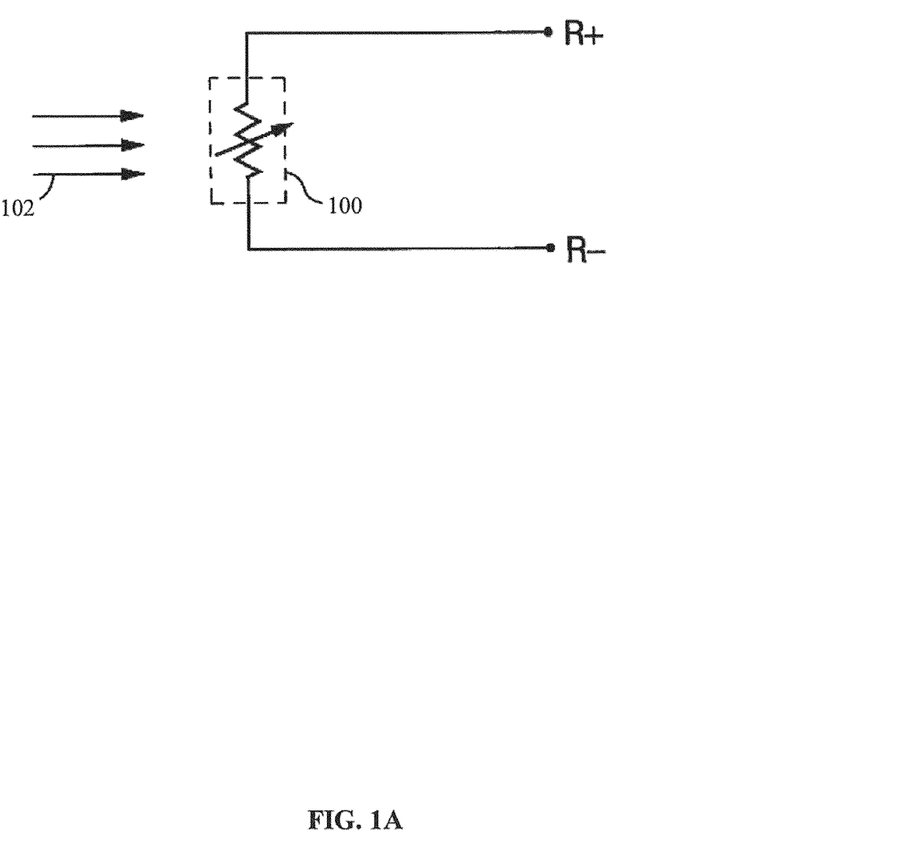
FIGS. 1A and 1B illustrate a schematic diagram and a perspective view, respectively, of a single microbolometer detector with two terminal interconnects in accordance with embodiments of the present disclosure.
Figure 1B:
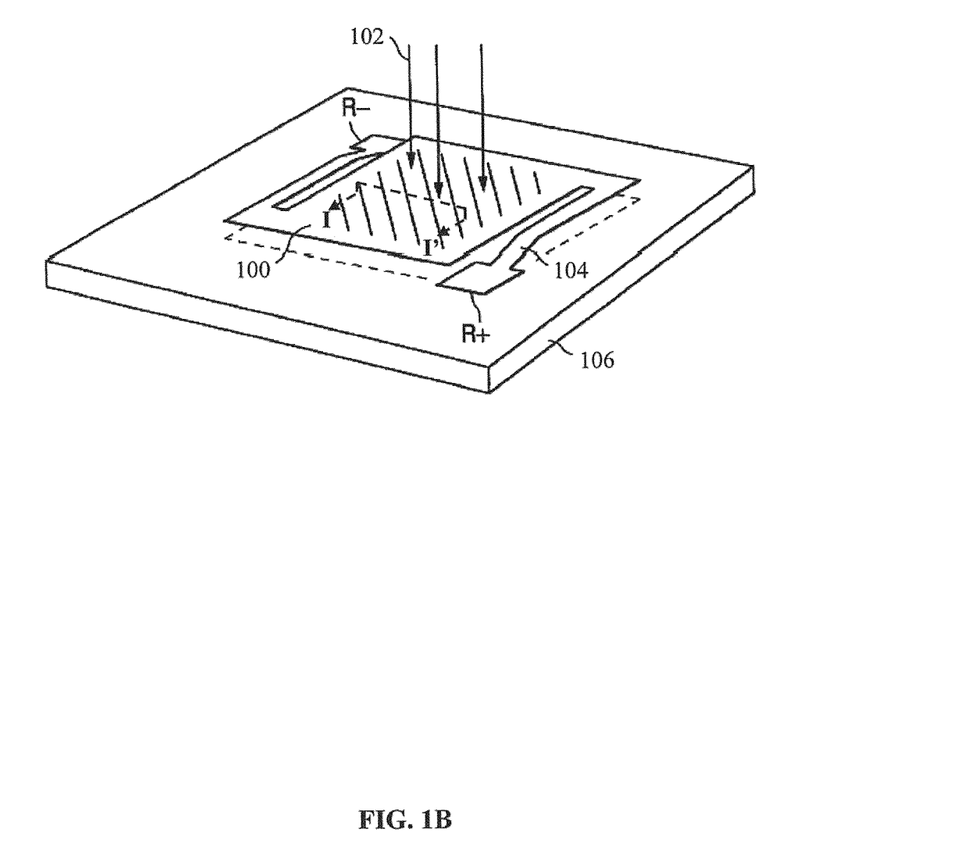

FIGS. 1A and 1B illustrate a schematic diagram and a perspective view, respectively, of a single microbolometer detector 100 with a two terminal interconnection in accordance with embodiments of the present disclosure.

Microbolometer 100 is thermally isolated from its supporting substrate or surroundings to allow the absorbed incident infrared radiation 102 to generate a temperature change in the microbolometer material. This isolation is designated by the dashed square box around the detector 100. The thermally isolated microbolometer 100 changes temperature in response to the incident radiation level, changes in the substrate temperature, and the electrical power dissipated in the detector during the measurement of the microbolometer resistance.

In systems where a single detector is employed, two conductive leads can be attached to the microbolometer material providing a means of conducting current through the microbolometer to sense its resistance. FIGS. 1A and 1B illustrate the electrical connection to the microbolometer detector. In this case, a thermally isolated microbolometer 100 is shown in the presence of incident infrared radiation 102 with two leads connecting to microbolometer terminals R+ and R−. FIG. 1B shows an example of a physical implementation of the microbolometer 100. The R+ and R− electrical connections to the microbolometer are created at the ends of legs 104 where the microbolometer comes in contact with a substrate 106.

Figure 2A:
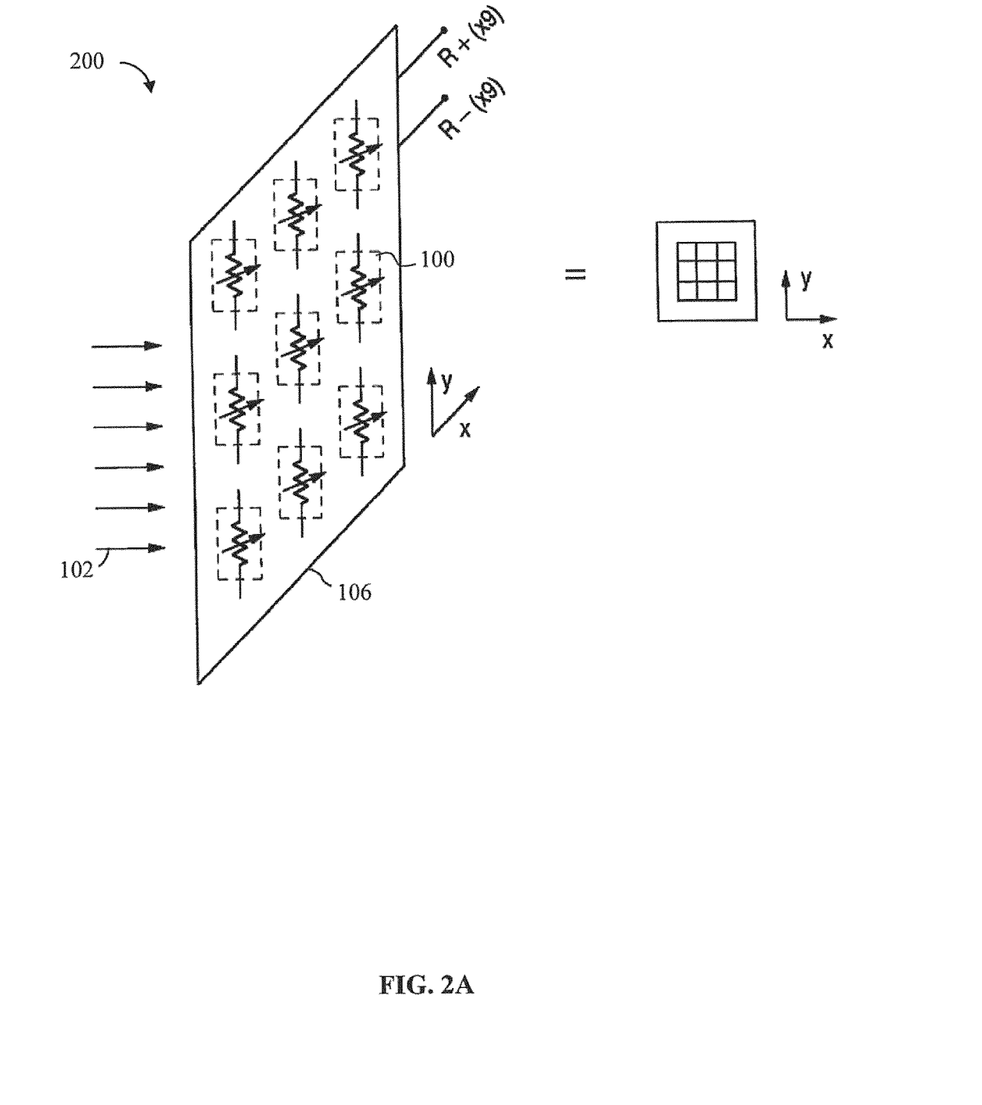
FIGS. 2A and 2B illustrate a schematic diagram and a perspective view, respectively, of a three-by-three array of two-terminal microbolometer detectors in accordance with embodiments of the present disclosure.
Figure 2B:
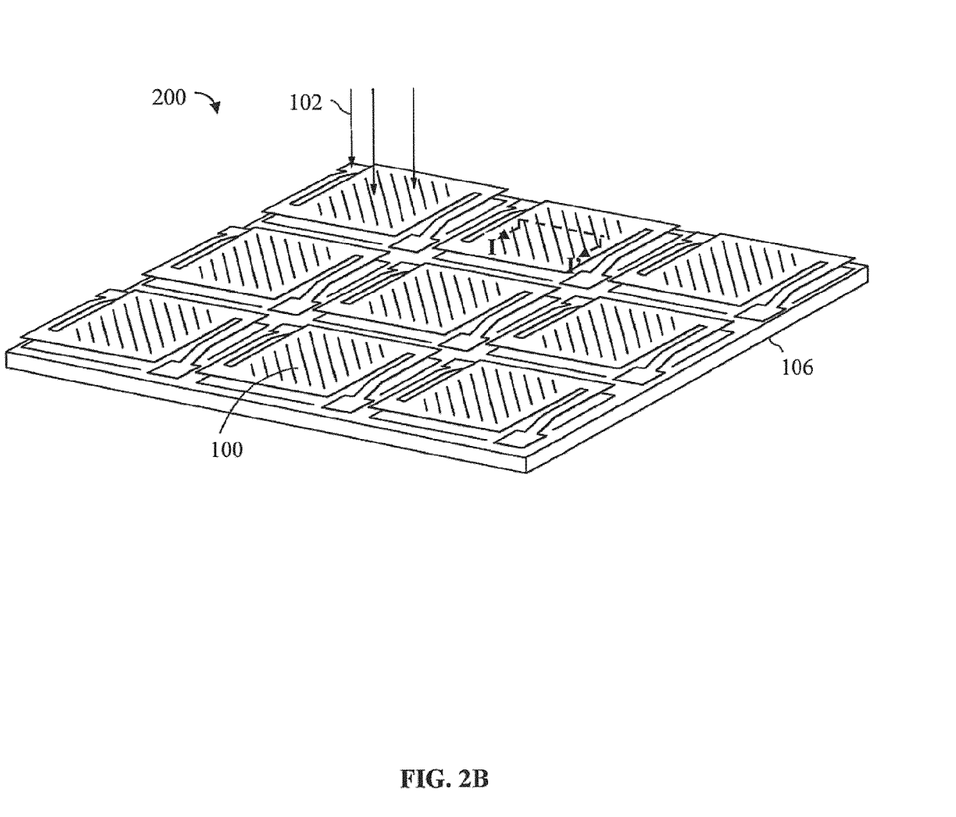

FIGS. 2A and 2B illustrate a schematic diagram and a perspective view, respectively, of a three-by-three array 200 of two-terminal microbolometer detectors 100 showing nine positive and negative interconnect terminals in accordance with embodiments of the present disclosure.

Figure 3:
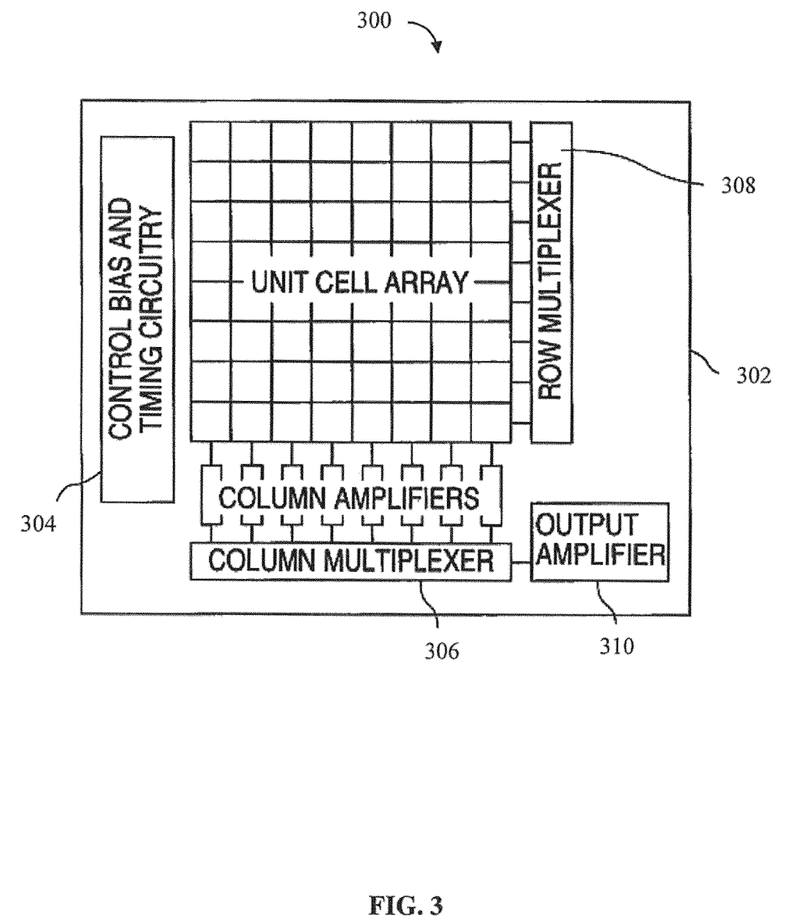
FIG. 3 illustrates an example of a read out integrated circuit (ROIC).

In cases where it is desired to sense the resistance or temperature of an array of microbolometer detectors it may become physically impractical to provide individual wire lead connections for each detector. FIGS. 2A, 2B, and 3 illustrate a method of interconnecting to a microbolometer detector array. Shown in FIGS. 2A and 2B is a three-by-three detector array 200 requiring nine positive and negative interconnects. Interconnects for the individual microbolometer detectors 100 in the array are created as part of the fabrication process, and contact the circuitry in the silicon substrate 106.

Large two-dimensional arrays of microbolometers can utilize a read out integrated circuit (ROIC) to provide the required bolometer interface, an example of which is illustrated in FIG. 3. The ROIC incorporates circuitry that is placed in spatial proximity to the detectors to perform the functions of the detector interface and multiplexing. The circuitry associated with a particular microbolometer detector may be located in the silicon substrate directly beneath the detector and may be referred to as the unit cell.

By time-multiplexing signals of the microbolometer detectors, the number of required electrical interconnect leads can be greatly reduced. To simplify the multiplexing process and system interface, the ROIC may include digital logic circuitry to generate the signals required to control row and column address switches in an array.

FIG. 3 illustrates an example ROIC for an 8×8 array of microbolometer detectors. The array of unit cells, column amplifiers, a column multiplexer 306, and a row multiplexer 308 may be integrated on to a single ROIC silicon die 302. The microbolometer array may be constructed on top of the unit cell array. The ROIC further includes bias generation and timing control circuitry 304 and an output amplifier 310. The ROIC provides critical interfaces for both the microbolometer detector array and the external system. Further descriptions of ROIC and microbolometer circuits may be found in U.S. Pat. No. 6,028,309, which is incorporated by reference in its entirety herein for all purposes.

Figure 4:
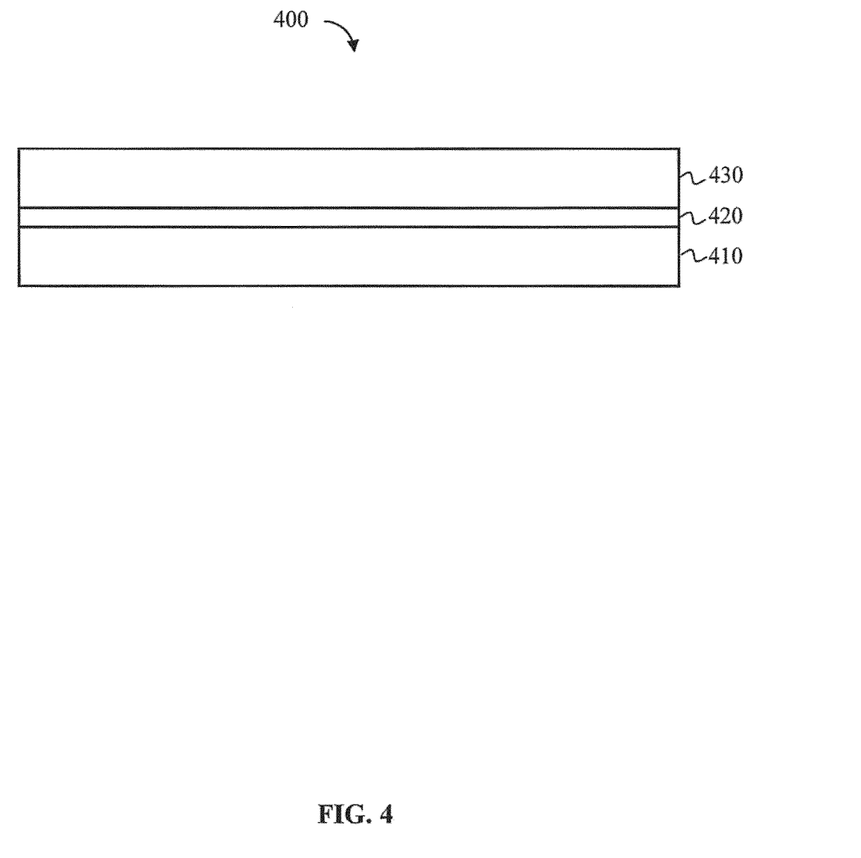
FIG. 4 illustrates a cross-sectional diagram of a microbolometer bridge with a multilayered dielectric in accordance with an embodiment of the present disclosure.

FIG. 4 illustrates a cross-sectional diagram of a microbolometer bridge 400 with a multilayered dielectric along a line I-I' in FIGS. 1B and 2B in accordance with an embodiment of the present disclosure.

Microbolometer bridge 400 includes a bottom multilayered dielectric 410, a detector layer 420 disposed above the bottom multilayered dielectric 410, and a top dielectric 430 disposed above the detector layer 420. In one example, bottom multilayered dielectric 410 may be comprised of a plurality of dielectric layers, such as silicon oxynitride (SiON) and/or silicon nitride. In one example, the detector layer 420 may be comprised of a temperature sensitive resistive material. For example, the detector layer 420 may be comprised of vanadium oxide and have a thickness between about 300 and about 800 angstroms. As a specific example, the detector layer 420 may be comprised of vanadium oxide and have a thickness of about 600 angstroms. In one example, top dielectric 430 may be comprised of a single dielectric layer or a plurality of dielectric layers, such as SiON and/or silicon nitride.

Figure 5:
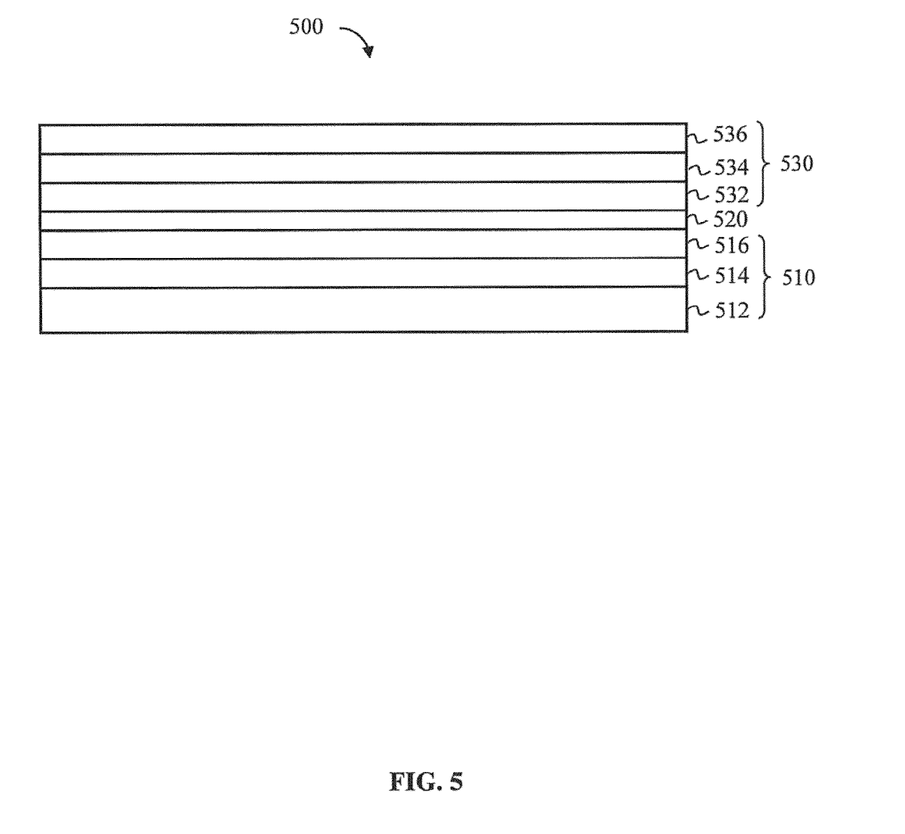
FIG. 5 illustrates a cross-sectional diagram of a microbolometer bridge with a multilayered dielectric in accordance with another embodiment of the present disclosure.

FIG. 5 illustrates a cross-sectional diagram of a microbolometer bridge 500 along a line I-I' in FIGS. 1B and 2B in accordance with another embodiment of the present disclosure.

Microbolometer bridge 500 includes a bottom multilayered dielectric 510, a detector layer 520 disposed above the bottom multilayered dielectric 510, and a top dielectric 530 disposed above the detector layer 520. Table 1 below shows thickness ranges and refractive indices of the various layers of microbolometer bridge 500 according to one example.

TABLE 1

| Layer | Thickness (Å) | Refractive Index |
|---|---|---|
| Top Dielectric | | |
| $(Si_mN_n)$ | 200-1200 | 1.6-2.2 |
| ($4^{th}$ $SiO_xN_y$) | 200-1200 | 1.3-1.9 |
| ($3^{rd}$ $SiO_xN_y$) | 200-1200 | 1.3-1.8 |
| Detector Layer | | |
| (Vanadium Oxide) | 300-800 | ~1.5 |
| Bottom Dielectric | | |
| ($2^{nd}$ $SiO_xN_y$) | 200-2000 | 1.3-1.8 |
| ($1^{st}$ $SiO_xN_y$) | 200-2000 | 1.3-1.9 |
| $(Si_mN_n)$ | 200-2000 | 1.6-2.2 |

In one example, bottom multilayered dielectric 510 includes a first silicon nitride layer 512, a first silicon oxynitride layer 514 disposed above first silicon nitride layer 512, and a second silicon oxynitride layer 516 disposed above the first silicon oxynitride layer 514. The first and second silicon oxynitride layers 514, 516 have different refractive indices in one example.

In one example, first silicon nitride layer 512 has a thickness between about 200 and about 2000 angstroms and a refractive index between about 1.6 and about 2.2, first silicon oxynitride layer 514 has a thickness between about 200 and about 2000 angstroms and a refractive index between about 1.3 and about 1.9, and second silicon oxynitride layer 516 has a thickness between about 200 and about 2000 angstroms and a refractive index between about 1.3 and about 1.8.

In one example, first silicon nitride layer 512 has a thickness of about 200 angstroms and a refractive index of about 2.1, first silicon oxynitride layer 514 has a thickness of about 750 angstroms and a refractive index of about 1.7, and second silicon oxynitride layer 516 has a thickness of about 500 angstroms and a refractive index of about 1.5. In one example, the first silicon oxynitride layer 514 and the second silicon oxynitride layer 516 are formed consecutively during one growth run.

In another example, first silicon nitride layer 512 has a thickness of about 200 angstroms and a refractive index of about 2.1, first silicon oxynitride layer 514 has a thickness of about 750 angstroms and a refractive index of about 1.7, and second silicon oxynitride layer 516 has a thickness of about 1500 angstroms and a refractive index of about 1.5. In one example, the first silicon oxynitride layer 514 and the second silicon oxynitride layer 516 are formed consecutively during one growth run.

In one example, the detector layer 520 may be comprised of a temperature sensitive resistive material. For example, the detector layer 520 may be comprised of vanadium oxide and have a thickness between about 300 and about 800 angstroms. As a specific example, the detector layer 520 may be comprised of vanadium oxide and have a thickness of about 600 angstroms.

In one example, top dielectric 530 is a top multilayered dielectric including a third silicon oxynitride layer 532 disposed above the detector layer 520, a fourth silicon oxynitride layer 534 disposed above the third silicon oxynitride layer 532, and a second silicon nitride layer 536 disposed above the fourth silicon oxynitride layer 534.

In one example, third silicon oxynitride layer 532 has a thickness between about 200 and about 1200 angstroms and a refractive index between about 1.3 and about 1.8, fourth silicon oxynitride layer 534 has a thickness between about 200 and about 1200 angstroms and a refractive index between about 1.3 and about 1.9, and second silicon nitride layer 536 has a thickness between about 200 and about 1200 angstroms and a refractive index between about 1.6 and about 2.2.

In one example, third silicon oxynitride layer 532 has a thickness of about 700 angstroms and a refractive index of about 1.5, fourth silicon oxynitride layer 534 has a thickness of about 750 angstroms and a refractive index of about 1.7, and second silicon nitride layer 536 has a thickness of about 700 angstroms and a refractive index of about 1.8. In one example, the third silicon oxynitride layer 532 and the fourth silicon oxynitride layer 534 are formed consecutively during one growth run.

In another example, third silicon oxynitride layer 532 has a thickness of about 800 angstroms and a refractive index of about 1.5, fourth silicon oxynitride layer 534 has a thickness of about 400 angstroms and a refractive index of about 1.7, and second silicon nitride layer 536 has a thickness of about 200 angstroms and a refractive index of about 2.1. In one example, the third silicon oxynitride layer 532 and the fourth silicon oxynitride layer 534 are formed consecutively during one growth run.

Figure 6:
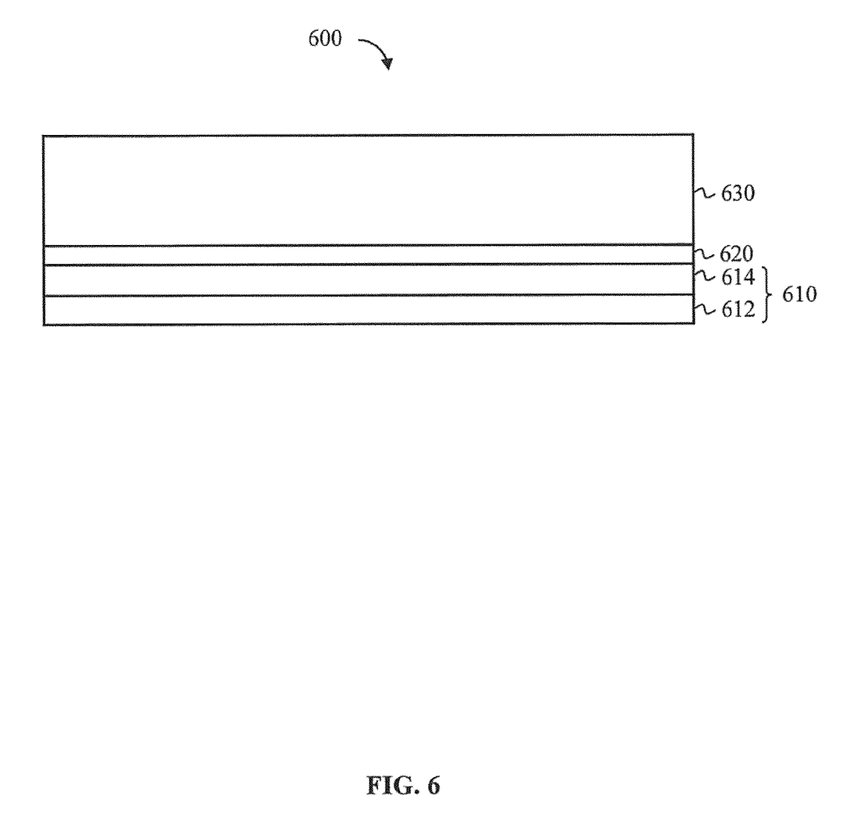
FIG. 6 illustrates a cross-sectional diagram of a microbolometer bridge with a multilayered dielectric in accordance with another embodiment of the present disclosure.

FIG. 6 illustrates a cross-sectional diagram of a microbolometer bridge 600 with a multilayered dielectric in accordance with another embodiment of the present disclosure.

Microbolometer bridge 600 includes a bottom multilayered dielectric 610, a detector layer 620 disposed above the bottom multilayered dielectric 610, and a top dielectric 630 disposed above the detector layer 620. Table 2 below shows thickness ranges and refractive indices of the various layers of microbolometer bridge 600 according to one example.

TABLE 2

| Layer | Thickness (Å) | Refractive Index |
|---|---|---|
| Top Dielectric | | |
| ($Si_mN_n$) Detector Layer | 800-1800 | 1.6-2.2 |
| (Vanadium Oxide) Bottom Dielectric | 300-800 | ~1.5 |
| ($2^{nd}$ $SiO_xN_y$) | 200-2000 | 1.3-1.9 |
| ($1^{st}$ $SiO_xN_y$) | 200-1500 | 1.3-1.8 |

In one example, bottom multilayered dielectric 610 includes a first silicon oxynitride layer 612 and a second silicon oxynitride layer 614 disposed above the first silicon oxynitride layer 612. The first and second silicon oxynitride layers 612, 614 have different refractive indices in one example.

In one example, first silicon oxynitride layer 612 has a thickness between about 200 and about 1500 angstroms and a refractive index between about 1.3 and about 1.8, and second silicon oxynitride layer 614 has a thickness between about 200 and about 2000 angstroms and a refractive index between about 1.3 and about 1.9.

In one example, first silicon oxynitride layer 612 has a thickness of about 750 angstroms and a refractive index of about 1.5, and second silicon oxynitride layer 614 has a thickness of about 1500 angstroms and a refractive index of about 1.7. As an example, the first silicon oxynitride layer 612 and the second silicon oxynitride layer 614 are formed consecutively during one growth run.

In one example, the detector layer 620 may be comprised of a temperature sensitive resistive material. For example, the detector layer 620 may be comprised of vanadium oxide and have a thickness between about 300 and about 800 angstroms. As a specific example, the detector layer 620 may be comprised of vanadium oxide and have a thickness of about 600 angstroms.

In one example, top dielectric 630 is comprised of silicon nitride and disposed above the detector layer 620. In one example, top dielectric 630 is comprised of silicon nitride and has a thickness between about 800 and about 1800 angstroms and a refractive index between about 1.6 and about 2.2. In one example, top dielectric 630 is comprised of silicon nitride and has a thickness of about 1200 angstroms and a refractive index of about 2.1.

The above described silicon nitride layers and silicon oxynitride layers may be deposited by plasma enhanced chemical vapor deposition (PECVD) using silane ($SiH_4$), nitrogen (N2), ammonia ($NH_3$), and/or nitrous oxide ($N_2O$) precursor gases, in one example, but other deposition methods and precursor gases may be applicable.

In one example, silicon oxynitride layers having a refractive index of about 1.5 may be formed by PECVD at a pressure of about 3.0 torr, a power of about 53 watts, and with about 100 sccm of $SiH_4$ and about 2800 sccm of $N_2O$.

In another example, silicon oxynitride layers having a refractive index of about 1.7 may be formed by PECVD at a pressure of about 4.0 torr, a power of about 260 watts, and with about 126 sccm of $SiH_4$, about 850 sccm of $N_2$, and about 100 sccm of $N_2O$.

In yet another example, silicon nitride layers having a compressive stress and a refractive index of about 2.1 may be formed by PECVD at a pressure of about 4.4 torr, a power of about 330 watts, and with about 190 sccm of $SiH_4$, about 30 sccm of $NH_3$, and about 2000 sccm of $N_2$.

Figure 7:
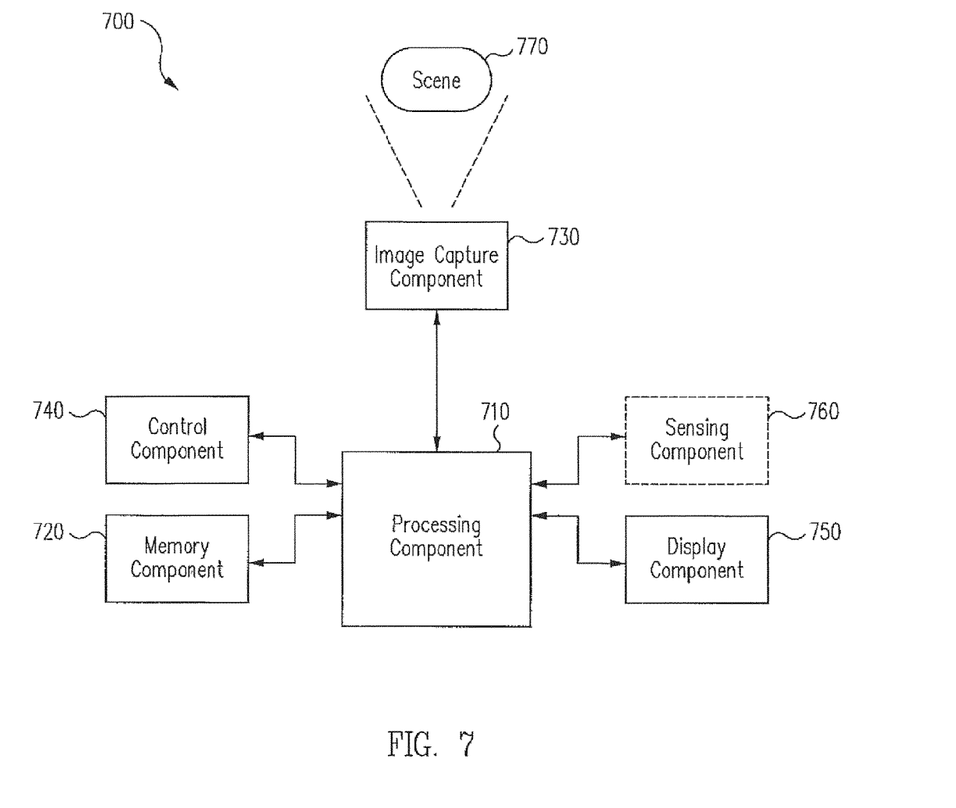
FIG. 7 illustrates a block diagram illustrating a system for capturing images in accordance with an embodiment of the present disclosure.

Referring now to FIG. 7, a block diagram is shown illustrating a system 700 (e.g., an infrared camera) for capturing images and processing in accordance with one or more embodiments. System 700 comprises, in one implementation, a processing component 710, a memory component 720, an image capture component 730, a control component 740, and/or a display component 750. System 700 may further include a sensing component 760.

System 700 may represent for example an infrared imaging device to capture and process images, such as video images of a scene 770. The system 700 may represent any type of infrared camera adapted to detect infrared radiation and provide representative data and information (e.g., infrared image data of a scene) or may represent more generally any type of electro-optical sensor system. In one example, system 700 may represent an infrared camera, a dual band imager such as a night vision imager that operates to sense reflected visible and/or SWIR light for high resolution images and LWIR radiation for thermal imaging, or an imager for sensing both short wave and long wave radiation simultaneously for providing independent image information. System 700 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed and may comprise a distributed networked system.

In various embodiments, processing component 710 may comprise any type of a processor or a logic device (e.g., a programmable logic device (PLD) configured to perform processing functions). Processing component 710 may be adapted to interface and communicate with components 720, 730, 740, and 750 to perform method and processing steps and/or operations, as described herein, including conventional system processing functions as would be understood by one skilled in the art.

Memory component 720 comprises, in one embodiment, one or more memory devices adapted to store data and information, including for example infrared data and information. Memory device 720 may comprise one or more various types of memory devices including volatile and non-volatile memory devices, and/or a machine-readable medium capable of storing data in a machine-readable format. Processing component 710 may be adapted to execute software stored in memory component 720 so as to perform method and process steps and/or operations described herein.

Image capture component 730 comprises, in one embodiment, any type of image sensor, such as for example one or more infrared sensors (e.g., any type of multi-pixel infrared detector, such as the microbolometer detectors and focal plane arrays as described herein) for capturing infrared image data (e.g., still image data and/or video data) representative of an image, such as scene 770. In one implementation, the infrared sensors of image capture component 730 provide for representing (e.g., converting) the captured image data as digital data (e.g., via an analog-to-digital converter included as part of the infrared sensor or separate from the infrared sensor as part of system 700). In one aspect, the infrared image data (e.g., infrared video data) may comprise non-uniform data (e.g., real image data) of an image, such as scene 770. Processing component 710 may be adapted to process the infrared image data (e.g., to provide processed image data), store the infrared image data in memory component 720, and/or retrieve stored infrared image data from memory component 720. For example, processing component 710 may be adapted to process infrared image data stored in memory component 720 to provide processed image data and information (e.g., captured and/or processed infrared image data).

Control component 740 comprises, in one embodiment, a user input and/or interface device. For example, the user input and/or interface device may represent a rotatable knob (e.g., potentiometer), push buttons, slide bar, keyboard, etc., that is adapted to generate a user input control signal. Processing component 710 may be adapted to sense control input signals from a user via control component 740 and respond to any sensed control input signals received therefrom. Processing component 710 may be adapted to interpret such a control input signal as a parameter value, as generally understood by one skilled in the art.

In one embodiment, control component 740 may comprise a control unit (e.g., a wired or wireless handheld control unit) having push buttons adapted to interface with a user and receive user input control values. In one implementation, the push buttons of the control unit may be used to control various functions of the system 700, such as autofocus, menu enable and selection, field of view, brightness, contrast, noise filtering, high pass filtering, low pass filtering, and/or various other features as understood by one skilled in the art.

Display component 750 comprises, in one embodiment, an image display device (e.g., a liquid crystal display (LCD) or various other types of generally known video displays or monitors). Processing component 710 may be adapted to display image data and information on the display component 750. Processing component 710 may be adapted to retrieve image data and information from memory component 720 and display any retrieved image data and information on display component 750. Display component 750 may comprise display electronics, which may be utilized by processing component 710 to display image data and information (e.g., infrared images). Display component 750 may be adapted to receive image data and information directly from image capture component 730 via the processing component 710, or the image data and information may be transferred from memory component 720 via processing component 710.

Sensing component 760 comprises, in one embodiment, one or more sensors of various types, depending on the application or implementation requirements, as would be understood by one skilled in the art. The sensors of optional sensing component 760 provide data and/or information to at least processing component 710. In one aspect, processing component 710 may be adapted to communicate with sensing component 760 (e.g., by receiving sensor information from sensing component 760) and with image capture component 730 (e.g., by receiving data and information from image capture component 730 and providing and/or receiving command, control, and/or other information to and/or from one or more other components of system 700).

In various implementations, sensing component 760 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 760 may represent conventional sensors as generally known by one skilled in the art for monitoring various conditions (e.g., environmental conditions) that may have an effect (e.g., on the image appearance) on the data provided by image capture component 730.

In some implementations, optional sensing component 760 (e.g., one or more of sensors) may comprise devices that relay information to processing component 710 via wired and/or wireless communication. For example, optional sensing component 760 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 700 may be combined and/or implemented or not, as desired or depending on the application or requirements, with system 700 representing various functional blocks of a related system. In one example, processing component 710 may be combined with memory component 720, image capture component 730, display component 750, and/or optional sensing component 760. In another example, processing component 710 may be combined with image capture component 730 with only certain functions of processing component 710 performed by circuitry (e.g., a processor, a microprocessor, a logic device, a microcontroller, etc.) within image capture component 730. Furthermore, various components of system 700 may be remote from each other (e.g., image capture component 730 may comprise a remote sensor with processing component 710, etc. representing a computer that may or may not be in communication with image capture component 730).

Figure 8:
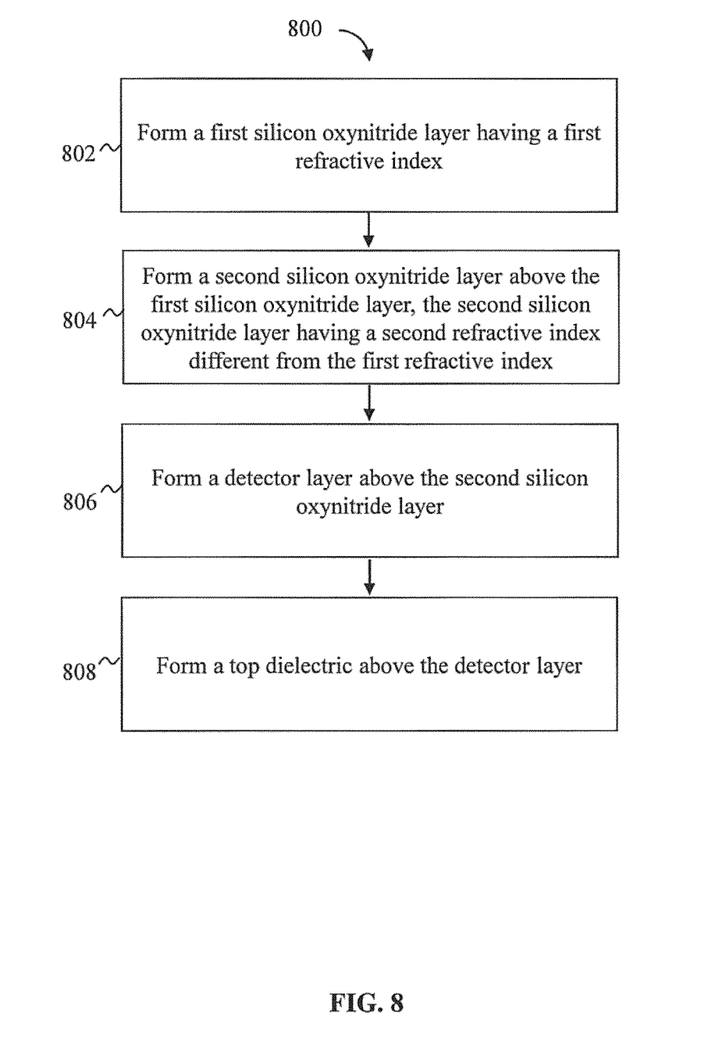
FIG. 8 illustrates a flowchart showing a method of fabricating a microbolometer including a multilayered dielectric in accordance with an embodiment of the present disclosure.

Referring now to FIG. 8, a flowchart shows a method 800 of fabricating a microbolometer in accordance with embodiments of the present disclosure. Method 800 includes forming a bottom multilayered dielectric including forming a first silicon oxynitride layer having a first refractive index, as shown at block 802, and forming a second silicon oxynitride layer above the first silicon oxynitride layer, as shown at block 804, the second silicon oxynitride layer having a second refractive index different from the first refractive index. Method 800 further includes forming a detector layer above the second silicon oxynitride layer, as shown at block 806, and forming a top dielectric above the detector layer, as shown at block 808.

It is noted that additional processes may be provided before, during, and after the method 800 of FIG. 8, and that some other processes may only be briefly described herein.

In accordance with an embodiment, forming the first silicon oxynitride layer and forming the second silicon oxynitride layer includes forming the layers consecutively during one growth run.

In accordance with an embodiment, forming the bottom multilayered dielectric includes forming a first silicon nitride layer and then forming the first silicon oxynitride layer above the first silicon nitride layer, and forming the top dielectric includes forming a top multilayered dielectric including: forming a third silicon oxynitride layer above the detector layer, forming a fourth silicon oxynitride layer above the third silicon oxynitride layer, and forming a second silicon nitride layer above the fourth silicon oxynitride layer.

In accordance with an embodiment, forming the top dielectric includes forming a silicon nitride layer above the detector layer.

In accordance with an embodiment, the method may further comprise electrically coupling the microbolometer to a readout circuit (ROIC) via contact legs, coupling a processor to the ROIC for processing image information output from the ROIC, and/or coupling a display to the processor for displaying the processed image information.

In view of the present disclosure, it will be appreciated that apparatus, systems, and methods as set forth herein advantageously may provide microbolometer detectors with increased sensitivity and/or a wider spectral response range.

In one example, the use of multilayered silicon oxynitride films advantageously extends the spectral absorption and spectral response of a microbolometer detector. In one example, absorbing dielectric layers of the microbolometer detector may absorb IR in the range of about 7 microns to about 14 microns, with a shift of an absorption peak to about 7 microns from about 9.5 microns.

Figure 9:
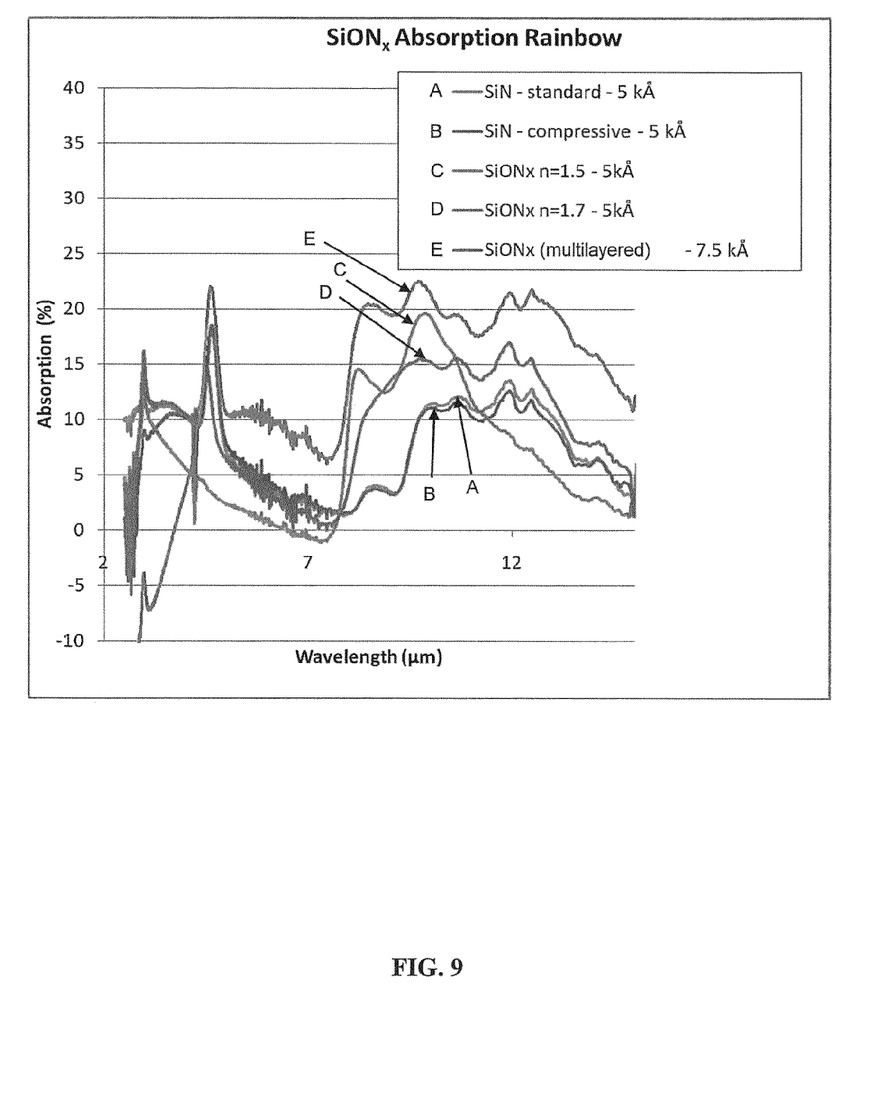
FIG. 9 illustrates an absorption graph in accordance with an embodiment of the present disclosure.

Referring now to FIG. 9, an absorption graph of different dielectric layers A-E is shown in accordance with an embodiment of the present disclosure. Dielectric layer A was a standard SiN layer having a thickness of about 5 kÅ. Dielectric layer B was a compressively strained SiN layer having a thickness of about 5 kÅ. Dielectric layer C was a SiONx layer having a refractive index of about 1.5 (and a higher oxygen content than dielectric layer D) and a thickness of about 5 kÅ. Dielectric layer D was a SiONx layer having a refractive index of about 1.7 (and a lower oxygen content than dielectric layers C and E) and a thickness of about 5 kÅ. Dielectric layer E was a SiONx multilayer having a thickness of about 7.5 kÅ and a higher total oxygen content than dielectric layers C and D. In other words, the oxygen content increased progressing from dielectric layer D (lowest) to dielectric layer C to dielectric layer E (highest). Dielectric layers A-E were formed by techniques and methods as described above. For example, layers with gradual variation form oxygen-rich to pure silicon nitride were created by adjusting the ratio of the reactive gases.

As is shown in FIG. 9, SiONx layers with increased oxygen content (layer D→layer C→layer E) and decreased refractive index showed an increase in absorption band and maximums of optical absorption shifted toward shorter wavelengths. Conversely, maximums of optical absorption shifted toward longer wavelengths with decreasing oxygen content and increasing refractive index of the dielectric layer.

It is understood that this disclosure provides many different embodiments, or examples, for implementing different features of the invention. Specific examples of components and arrangements are described herein to simplify the present disclosure. These are, of course, merely examples and are not intended to be limiting. Moreover, the formation of a first feature over or on a second feature in the description herein may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Embodiments described above illustrate but do not limit the disclosure. It should also be understood that numerous modifications and variations are possible in accordance with the principles of the present disclosure. Accordingly, the scope of the disclosure is defined only by the following claims.

What is claimed as new and desired to be protected is:
1. A microbolometer, comprising:
   a bottom multilayered dielectric, including:
     a first silicon oxynitride layer,
     a second silicon oxynitride layer disposed above the first silicon oxynitride layer, the first and second silicon oxynitride layers having different refractive indices, and
     a silicon nitride layer disposed below the first silicon oxynitride layer;
   a detector layer disposed above the bottom multilayered dielectric, the detector layer comprised of a temperature sensitive resistive material; and a top dielectric disposed above the detector layer.

2. The microbolometer of claim 1, wherein the silicon nitride layer disposed below the first silicon oxynitride layer comprises a first silicon nitride layer and wherein the second silicon oxynitride layer has a refractive index that is less than a refractive index of the first silicon oxynitride layer.

3. The microbolometer of claim 2, wherein the first silicon oxynitride layer and the second silicon oxynitride layer are formed consecutively during one growth run.

4. The microbolometer of claim 2,
wherein the first silicon nitride layer has a thickness between about 200 and about 2000 angstroms and a refractive index between about 1.6 and about 2.2,
wherein the first silicon oxynitride layer has a thickness between about 200 and about 2000 angstroms and a refractive index between about 1.3 and about 1.9,
wherein the second silicon oxynitride layer has a thickness between about 200 and about 2000 angstroms and a refractive index between about 1.3 and about 1.8, and
wherein the thickness of the second silicon oxynitride layer is greater than the thickness of the first silicon oxynitride layer.

5. The microbolometer of claim 2, wherein the detector layer is comprised of vanadium oxide and has a thickness between about 300 and about 800 angstroms.

6. The microbolometer of claim 2, wherein the top dielectric is a top multilayered dielectric including:
a third silicon oxynitride layer disposed above the detector layer;
a fourth silicon oxynitride layer disposed above the third silicon oxynitride layer; and
a second silicon nitride layer disposed above the fourth silicon oxynitride layer.

7. The microbolometer of claim 6, wherein the third silicon oxynitride layer and the fourth silicon oxynitride layer are formed consecutively during one growth run.

8. The microbolometer of claim 6,
wherein the third silicon oxynitride layer has a thickness between about 200 and about 1200 angstroms and a refractive index between about 1.3 and about 1.8,
wherein the fourth silicon oxynitride layer has a thickness between about 200 and about 1200 angstroms and a refractive index between about 1.3 and about 1.9,
wherein the second silicon nitride layer has a thickness between about 200 and about 1200 angstroms and a refractive index between about 1.6 and about 2.2,
wherein the second silicon oxynitride layer has a refractive index that is less than a refractive index of the first silicon oxynitride layer, and
wherein the second silicon oxynitride layer has a thickness that is greater than a thickness of the first silicon oxynitride layer.

9. The microbolometer of claim 1, wherein the first silicon oxynitride layer and the second silicon oxynitride layer are formed consecutively during one growth run.

10. The microbolometer of claim 1, wherein the detector layer is comprised of vanadium oxide and has a thickness between about 300 and about 800 angstroms.

11. The microbolometer of claim 1,
wherein the first silicon oxynitride layer has a thickness between about 200 and about 1500 angstroms and a refractive index between about 1.3 and about 1.8, and
wherein the second silicon oxynitride layer has a thickness between about 200 and about 2000 angstroms and a refractive index between about 1.3 and about 1.9.

12. The microbolometer of claim 11, wherein the top dielectric includes a silicon nitride layer disposed above the detector layer, the silicon nitride layer having a thickness between about 800 and about 1800 angstroms and a refractive index between about 1.6 and about 2.2.

13. A focal plane array, comprising:
a readout circuit (ROIC); and
a plurality of microbolometers electrically coupled to the ROIC, each microbolometer including:
a bottom multilayered dielectric, including:
a first silicon oxynitride layer,
a second silicon oxynitride layer disposed above the first silicon oxynitride layer, the first and second silicon oxynitride layers having different refractive indices, and
a silicon nitride layer disposed below the first silicon oxynitride layer;
a detector layer disposed above the bottom multilayered dielectric, the detector layer comprised of a temperature sensitive resistive material; and
a top dielectric disposed above the detector layer.

14. The focal plane array of claim 13, wherein each microbolometer is electrically coupled to the ROIC via contact legs disposed between adjacent microbolometers.

15. The focal plane array of claim 14, wherein at least one of the contact legs is a shared contact leg disposed between adjacent microbolometers.

16. The focal plane array of claim 13, further comprising a processor coupled to the ROIC for processing image information output from the ROIC, and a display coupled to the processor for displaying the processed image information.

17. The focal plane array of claim 13,
wherein the silicon nitride layer disposed below the first silicon oxynitride layer comprises a first silicon nitride layer; and
wherein the top dielectric is a top multilayered dielectric including:
a third silicon oxynitride layer disposed above the detector layer,
a fourth silicon oxynitride layer disposed above the third silicon oxynitride layer, and
a second silicon nitride layer disposed above the fourth silicon oxynitride layer.

18. The focal plane array of claim 13, wherein the top dielectric layer includes a silicon nitride layer disposed above the detector layer.

19. A method of fabricating a microbolometer, the method comprising:
forming a bottom multilayered dielectric including:
forming a first silicon oxynitride layer having a first refractive index,
forming a second silicon oxynitride layer above the first silicon oxynitride layer, the second silicon oxynitride layer having a second refractive index different from the first refractive index,
forming a silicon nitride layer below the first silicon oxynitride layer;
forming a detector layer above the second silicon oxynitride layer, the detector layer comprised of a temperature sensitive resistive material; and
forming a top dielectric above the detector layer.

20. The method of claim 19, wherein forming the first silicon oxynitride layer and forming the second silicon oxynitride layer includes forming the layers consecutively during one growth run.

21. The method of claim 19,
wherein forming the bottom multilayered dielectric includes forming the silicon nitride layer as a first silicon nitride layer and then forming the first silicon oxynitride layer above the first silicon nitride layer; and wherein forming the top dielectric includes forming a top multilayered dielectric including:

forming a third silicon oxynitride layer above the detector layer, forming a fourth silicon oxynitride layer above the third silicon oxynitride layer, and forming a second silicon nitride layer above the fourth silicon oxynitride layer.

22. The method of claim 19, wherein forming the top dielectric includes forming an additional silicon nitride layer above the detector layer.

23. The method of claim 19, further comprising electrically coupling the microbolometer to a readout circuit (ROIC) via contact legs.

24. The method of claim 23, further comprising:

coupling a processor to the ROIC for processing image information output from the ROIC; and coupling a display to the processor for displaying the processed image information.

\* \* \* \* \*